(12) United States Patent
Lee (10) Patent No.: US 8,993,965 B2
(45) Date of Patent: Mar. 31, 2015

(54) INFRARED SENSOR ARRAY AND MANUFACTURING METHOD OF INFRARED SENSOR

(71) Applicant: Unimems Manufacturing Co., Ltd., Hsinchu (TW)

(72) Inventor: Tzong-Sheng Lee, Miaoli County (TW)

(73) Assignee: Unimems Manufacturing Co., Ltd., Hsinchu (TW)

( * ) Notice: Subject to any disclaimer, the term of this patent is extended or adjusted under 35 U.S.C. 154(b) by 169 days.

(21) Appl. No.: 13/740,224

(22) Filed: Jan. 13, 2013

(65) Prior Publication Data
US 2014/0197318 A1    Jul. 17, 2014

(51) Int. Cl.
*G01J 5/10* (2006.01)
*H01L 31/18* (2006.01)
*H01L 27/144* (2006.01)

(52) U.S. Cl.
CPC ............ *H01L 31/18* (2013.01); *H01L 27/1443* (2013.01)
USPC .............................. 250/338.4; 438/54; 438/57

(58) Field of Classification Search
USPC .................. 250/338.1, 338.4, 349; 438/54, 57
See application file for complete search history.

(56) References Cited

U.S. PATENT DOCUMENTS

2005/0258352 A1* 11/2005 Duncan et al. ............. 250/252.1

* cited by examiner

*Primary Examiner* — Mark R Gaworecki
(74) *Attorney, Agent, or Firm* — Li & Cai Intellectual Property (USA) Office (57) ABSTRACT

An infrared sensor array with interconnection type, comprises a substrate, a plurality of circuit units, and a plurality of infrared sensing modules. The substrate defines several sensing segments. Each sensing segment has a base portion, a connecting portion, and a testing portion. The connecting portion is arranged between the base portion and the testing portion. The circuit units are respectively formed on the sensing segments. Each circuit unit has a base circuit, a connecting circuit, and a testing circuit. The connecting circuit electrically connects to the base circuit and the testing circuit. Each base circuit is formed on each base portion, each connecting circuit is formed on each connecting portion, and each testing circuit is formed on each testing portion. The infrared sensing modules are respectively disposed on the base portions and electrically connected to the base circuits.

17 Claims, 6 Drawing Sheets

FIG. 9 providing a substrate, wherein the substrate is defined as a plurality of sensing segments abreast arranged along a first direction, and each sensing segment is defined as a base portion, a connecting portion, and a testing portion abreast arranged along a second direction ~S110 forming a plurality of circuit units respectively on the sensing segments, wherein each circuit unit has a base circuit, a connecting circuit, and a testing circuit, and the connecting circuit electrically connects to the base circuit and the testing circuit, and wherein the base circuits are respectively formed on the base portions, the connecting circuits are respectively formed on the connecting portions, and the testing circuits are respectively formed on the testing portions ~S120 disposing a plurality of infrared sensing modules respectively on the base portions and electrically connecting to the base circuits, wherein each base portion, the corresponding base circuit, and the corresponding infrared sensing module are defined as the infrared sensor ~S130 testing the infrared sensors simultaneously by the testing circuits ~S140 obtaining a row of the infrared sensors connected in one piece along the first direction by cutting the substrate along a first parting line ~S150 cutting the row of the infrared sensorsalong a plurality of second parting lines ~S160

FIG. 10

INFRARED SENSOR ARRAY AND MANUFACTURING METHOD OF INFRARED SENSOR

BACKGROUND OF THE INVENTION

1. Field of the Invention

The instant disclosure relates to a sensor and a manufacturing method of a sensor; more particular, to an infrared sensor array and a manufacturing method of an infrared sensor.

2. Description of Related Art

The manufacturing method of a conventional infrared sensor has the steps as follows: preparing a wafer; cutting the wafer into a plurality of chips; bonding one chip on a base seat by a die bonder; disposing a thermistor on the base seat; connecting the chip and the thermistor to a plurality of pins of the base seat by a wire bonder; and disposing a cover with a filter on the base seat to obtain the conventional infrared sensor.

However, as described above, the conventional infrared sensors are produced one by one, and the conventional infrared sensors are tested one by one. Thus, the cost of the conventional infrared sensors cannot be reduced efficiently.

To achieve the abovementioned improvement, the inventors strive via industrial experience and academic research to present the instant disclosure, which can provide additional improvement as mentioned above.

SUMMARY OF THE INVENTION

One embodiment of the instant disclosure provides an infrared sensor array and a manufacturing method of an infrared sensor, which enable the infrared sensors to be tested simultaneously by the testing circuits.

The infrared sensor array comprises a substrate, a plurality of circuit units, and a plurality of infrared sensing modules. The substrate defines a plurality of sensing segments, wherein each sensing segment has a base portion, a connecting portion, and a testing portion, and the connecting portion is arranged between the base portion and the testing portion. The circuit units are respectively formed on the sensing segments, wherein each circuit unit has a base circuit, a connecting circuit, and a testing circuit, and the connecting circuit electrically connects to the base circuit and the testing circuit. The base circuits are respectively formed on the base portions, the connecting circuits are respectively formed on the connecting portions, and the testing circuits are respectively formed on the testing portions. The infrared sensing modules are respectively disposed on the base portions and electrically connected to the base circuits; wherein each base portion, the corresponding base circuit, and the corresponding infrared sensing module are defined as an infrared sensor, and wherein the infrared sensor array is configured to test the infrared sensors simultaneously by the testing circuits.

Preferably, the substrate defines a first parting line and a plurality of second parting lines, wherein the infrared sensors are arranged on one side of the first parting line, the connecting portions, the testing portions, the connecting circuits, and the testing circuits are arranged on another side of the first parting line, and wherein each second parting line is arranged between two adjacent base portions, or at least two of the base portions are arranged between two adjacent second parting lines.

The manufacturing method of an infrared sensor comprises: providing a substrate, wherein defining the substrate as a plurality of sensing segments abreast arranged along a first direction, and defining each sensing segment as a base portion, a connecting portion, and a testing portion abreast arranged along a second direction, and wherein the second direction is approximately perpendicular to the first direction; forming a plurality of circuit units respectively on the sensing segments, wherein each circuit unit has a base circuit, a connecting circuit, and a testing circuit, and the connecting circuit electrically connects to the base circuit and the testing circuit, and wherein the base circuits are respectively formed on the base portions, the connecting circuits are respectively formed on the connecting portions, and the testing circuits are respectively formed on the testing portions; and disposing a plurality of infrared sensing modules respectively on the base portions and electrically connecting to the base circuits, thereby forming an infrared sensor array; wherein each base portion, the corresponding base circuit, and the corresponding infrared sensing module are defined as the infrared sensor.

Preferably, after forming the infrared sensor array, the infrared sensors are tested simultaneously by the testing circuits, and then a row of the infrared sensors connected in one piece along the first direction is obtained by removing the connecting portions, the testing portions, the connecting circuits, and the testing circuits.

Base on the above, the infrared sensor array and the manufacturing method of the infrared sensor are suitable to be used for mass production of the infrared sensors. The infrared sensor array is configured to test all the infrared sensors thereof simultaneously for reducing the testing time and the producing cost.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
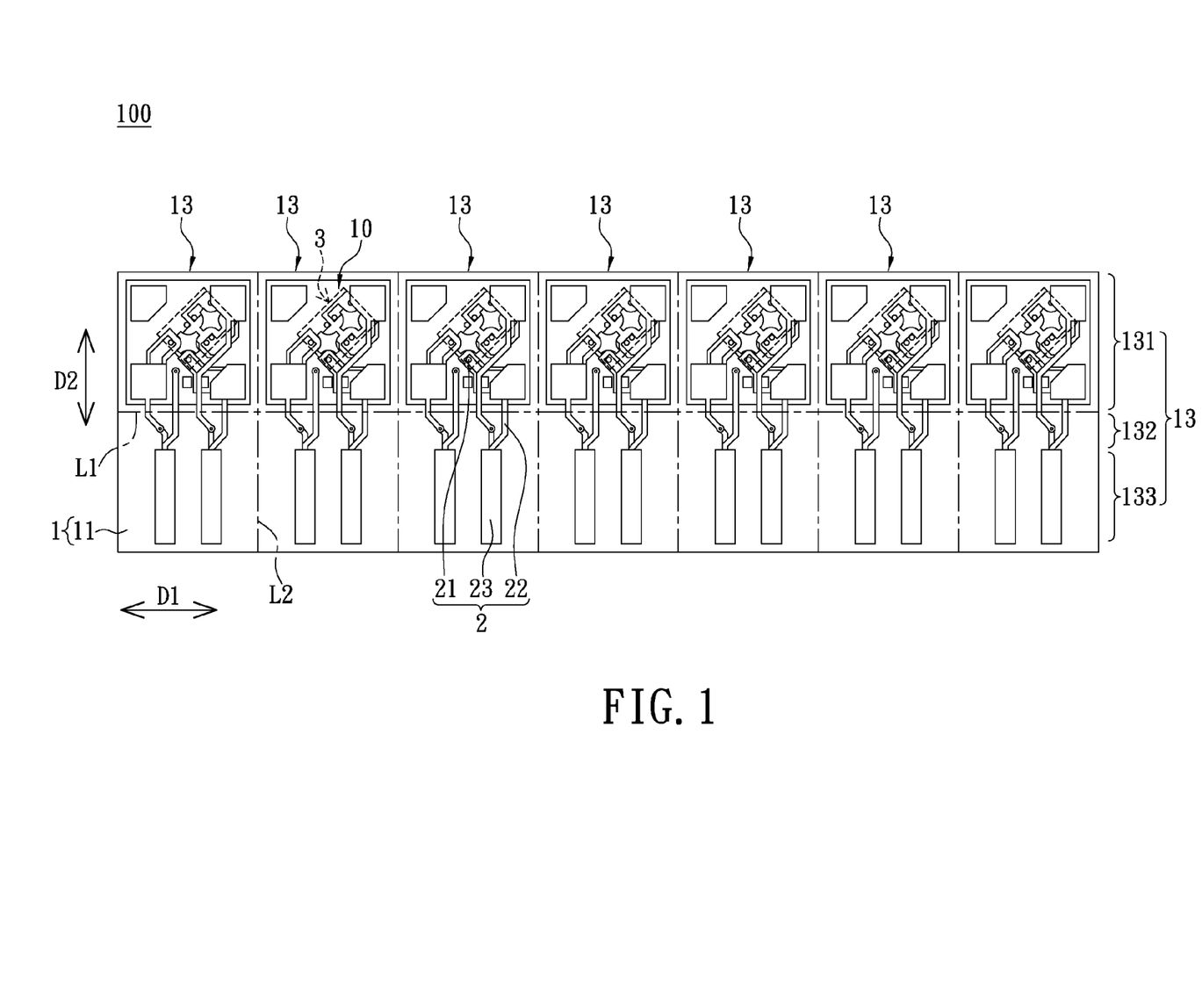
FIG. 1 is a perspective view of an infrared sensor array of the instant disclosure.

Please refer to FIG. 1, which shows a preferable embodiment of the instant disclosure. This embodiment provides an infrared sensor array and a manufacturing method of an infrared sensor. The following description states the infrared sensor array firstly, and then states the manufacturing method of the infrared sensor.

The infrared sensor array 100 includes a substrate 1 having an elongated shape, a plurality of circuit units 2, and a plurality of infrared sensing modules 3. The substrate 1 can be a printed circuit board (PCB), an IC substrate, or a ceramic substrate, but not limited thereto.

Figure 4:
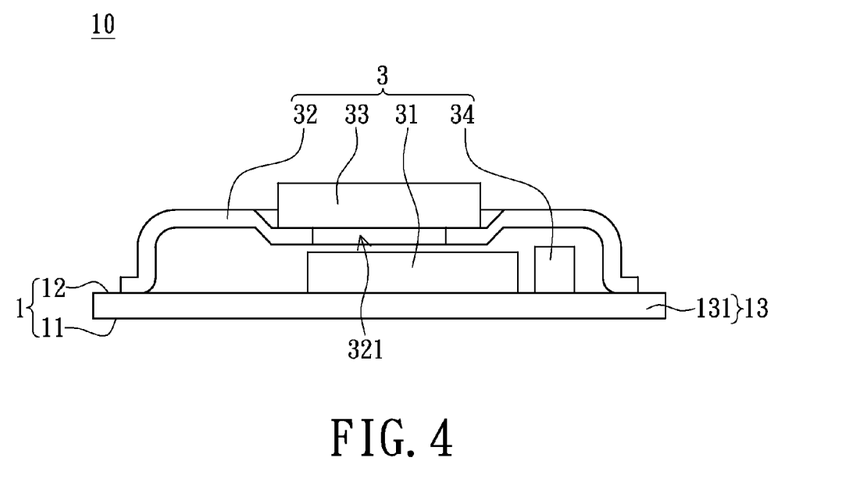
FIG. 4 is a section view of the infrared sensor of the instant disclosure.

The substrate 1 has a first plane 11 and an opposite second plane 12 (as shown in FIG. 4). The substrate 1 is defined as a plurality of sensing segments 13 along a first direction D1, that is to say, the sensing segments 13 are identical and arranged side by side along the first direction D1.

Each sensing segment 13 is defined as a base portion 131, a connecting portion 132, and a testing portion 133 along a second direction D2, that is to say, the base portion 131, the connecting portion 132, and the testing portion 133 of each sensing segment 13 are arranged side by side along the second direction D2.

Moreover, the second direction D2 in this embodiment is perpendicular to the first direction D1, but not limited thereto. The base portion 131 of each sensing 13 has a square shape.

The circuit units 2 are respectively formed on the sensing segments 13. Each circuit unit 2 has a base circuit 21, a connecting circuit 22, and a testing circuit 23, and the connecting circuit 22 electrically connects to the base circuit 21 and the testing circuit 23.

Specifically, the base circuits 21 are respectively formed on the base portions 131, the connecting circuits 22 are respectively formed on the connecting portions 132, and the testing circuits 23 are respectively formed on the testing portions 133. In other words, the circuit on the base portion 131 of each sensing segment 13 is the base circuit 21, but FIGS. 1~3 only label partial base portions 131 for example. Likewise, FIGS. 1~3 only label partial connecting circuits 22 and partial testing circuits 23 for example.

Moreover, the base circuits 21, the connecting circuits 22, and the testing circuits 23 of each circuit unit 2 are formed on the first plane 11 and the second plane 12 of the substrate 1.

Specifically, the structure of the testing portions 133 and the corresponding testing circuits 23 has an elongated shape and is parallel to the second direction D2, and the testing circuits 23 are arranged along the second direction D2 and spaced from each other. In other words, the testing portions 133 and the testing circuits 23 are formed as a golden finger structure, but not limited thereto. That is to say, the golden finger structure can be changed according to the designer's demand, for example, the testing portions 133 and the testing circuits 23 can be formed as a general electrode structure. In other words, the structure of the testing portions 133 and the testing circuits 23 is provided for the contact of the external probes or any contact type (e.g., spring).

The infrared sensing modules 3 are respectively disposed on the second plane 12 of the substrate 1 (as shown in FIG. 4) and disposed on the base portions 131 of the sensing segments 13. Each infrared sensing module 3 is connected to one portion of the corresponding base circuit 21, which is formed on the second plane 12, for establishing an electrical connection (not shown). Moreover, each base portion 131, the corresponding base circuit 21, and the corresponding infrared sensing module 3 are defined as the infrared sensor 10.

Moreover, the size of each base portion 131 is only configured to carry one infrared sensing module 3, that is to say, the contour of each infrared sensor 10 is similar to the contour of each infrared sensing module 3, thereby reducing the size of the infrared sensor 10.

Thus, the infrared sensor array 100 is configured to test all the infrared sensors 10 thereof simultaneously by the testing circuits 23. That is to say, the infrared sensors 10 are tested by connecting the golden finger structure to a testing apparatus (not shown) for reducing the testing time and the producing cost.

In addition, the substrate 1 defines a first parting line L1, which is parallel to the first direction D1. The first parting line L1 is arranged between the base portions 131 and the connecting portions 132.

That is to say, the infrared sensors 10 are arranged on one side of the first parting line L1, the connecting portions 132, the testing portions 133, the connecting circuits 22, and the testing circuits 23 are arranged on another side of the first parting line L1.

The substrate 1 also defines a plurality of second parting lines L2, which are parallel to the second direction D2, and the number of the second parting lines L2 can be adjusted by the designer's demand.

Figure 2:
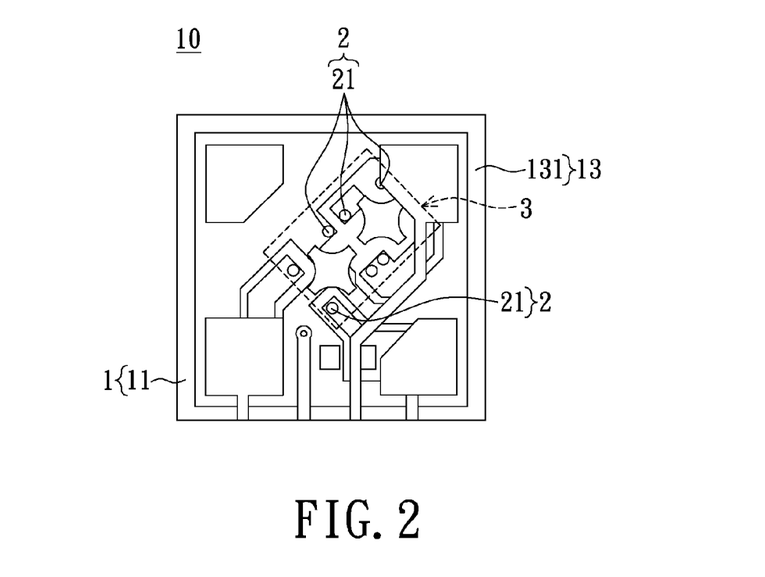
FIG. 2 is a perspective view of an infrared sensor of the instant disclosure by cutting the infrared sensor array.

Please refer to FIG. 2, if the designer wants to form the infrared sensor 10 with single type, each second parting line L2 is arranged between two adjacent base portions 131, that is to say, any two adjacent base portions 131 have one second parting line L2 arranged therebetween.

Figure 3:
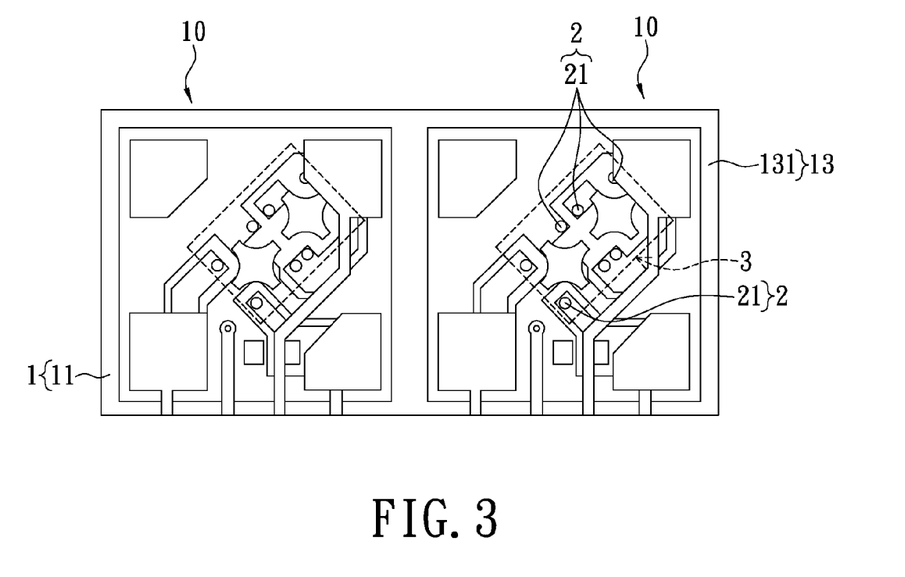
FIG. 3 is a perspective view of an infrared sensor set having two infrared sensors connected side by side of the instant disclosure by cutting the infrared sensor array.

Please refer to FIG. 3, if the designer wants to form an infrared sensor set having at least two infrared sensors 10 connected side by side in one piece, one second parting line L2 is arranged between one group of the base portions 131 and another group of the base portions 131, that is to say, at least two of the base portions 131 are arranged between two adjacent second parting lines L2. For example, as FIG. 1 shown, the substrate 1 does not define partial of the second parting lines L2, which is the $2^{nd}$, the $4^{th}$, and the $6^{th}$ of the second parting lines L2 by counting from left to right.

Thus, after testing the infrared sensors 10, the substrate 1 is cut along the first parting line L1 to remove the connecting portions 132, the testing portions 133, the connecting circuits 22, and the testing circuits 23, and then the substrate 1 is cut along the second parting lines L2 to obtain the suitable infrared sensor type (e.g., the single infrared sensor 10 or the infrared sensor set).

Figure 5:
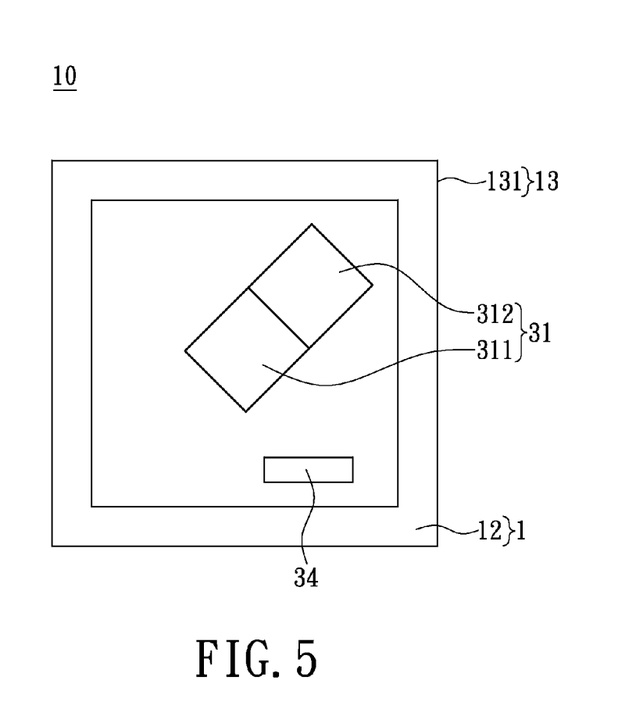
FIG. 5 is a perspective view of the infrared sensor of the instant disclosure, when the temperature measuring chip and the temperature compensating chip are connected in one piece.
Figure 6:
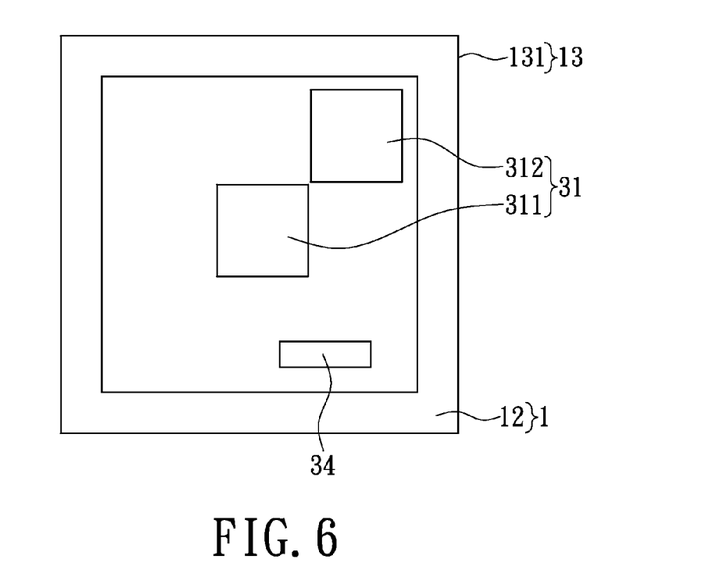
FIG. 6 is a perspective view of the infrared sensor of the instant disclosure, when the temperature measuring chip and the temperature compensating chip are separated from each other.

The following description states the infrared sensors 10 and takes one infrared sensor 10, as shown in FIGS. 4 to 6, for example.

Specifically, in each infrared sensor 10, the infrared sensing module 3 has an infrared sensing unit 31, a cover unit 32, a filtering unit 33, and a thermistor 34.

The infrared unit 31 is disposed on the base portion 131 and electrically connected to the base circuit 21. Each infrared sensing unit 31 has a temperature measuring chip 311 and a temperature compensating chip 312, and the structure of the temperature measuring chip 311 is identical to the structure of the temperature compensating chip 312 (e.g., square shape).

The temperature measuring chip 311 is configured to receive an infrared signal and a noise, and the temperature compensating chip 312 is configured to receive a noise for eliminating the noise received by the temperature measuring chip 311.

Specifically, please refer to FIG. 5, in the said infrared sensor 10, the temperature measuring chip 311 and the temperature compensating chip 312 are connected in one piece to form an elongated structure, that is to say, the infrared sensing unit 31 is formed in one piece. In more detail, when producing the temperature measuring chip 311 and the temperature compensating chip 312, cutting a wafer into a plurality pairs of connected chips for reducing the producing time and the producing cost.

The longitudinal direction of the infrared sensing unit 31 is substantially parallel to a diagonal of the base portion 131, and the temperature measuring chip 311 and the temperature compensating chip 312 are arranged on the diagonal of the base portion 131.

In this embodiment, the temperature measuring chip 311 is disposed on the center of the base portion 131, and the diagonal of the temperature measuring chip 311 and the diagonal of the base portion 131 are intersecting to form 45 degrees, but not limited thereto.

The length of one portion of the diagonal of the base portion 131, which under the infrared sensing unit 31, equals to the sum of the side length of temperature measuring chip 311 and the side length of the temperature compensating chip 312.

Moreover, please refer to FIG. 6, in the infrared sensor 10, the temperature measuring chip 311 and the temperature compensating chip 312 can be designed to separate from each other. That is to say, each one of the temperature measuring chip 311 and the temperature compensating chip 312 is an independent structure.

A diagonal of the temperature measuring chip 311 and a diagonal of the temperature compensating chip 312 are parallel to the diagonal of the base portion 131. The temperature measuring chip 311 and the temperature compensating chip 312 are arranged on the diagonal of the base portion 131.

In this embodiment, the temperature measuring chip 311 is disposed on the center of the base portion 131, and the length of one portion of the diagonal of the base portion 131, which under the infrared sensing unit 31, equals to the sum of the diagonal length of temperature measuring chip 311 and the diagonal length of the temperature compensating chip 312.

Thus, comparing to the separation of the temperature measuring chip 311 and the temperature compensating chip 312, the infrared sensing unit 31 formed in one piece is adapted effectively for reducing the size of the base portion 131.

Please refer to FIG. 4. The cover unit 32 in this embodiment takes a metallic cover for example. The cover unit 32 has a thru hole 321 formed in the center thereof. The cover unit 32 is fixed on the base portion 131 and covering the infrared sensing unit 31.

The temperature measuring chip 311 is aligned to the thru hole 321 of the cover unit 32 for enabling the temperature measuring chip 311 to receive the infrared signal via the thru hole 321.

Moreover, a metallic coating layer, which has a radiation rate lower than the cover unit 32 (e.g., gold or nickel), coats on an inner surface of the cover unit 32, so that the metallic coating layer is configured to prevent the external noise from interfering the infrared sensing unit 31. When the cover unit 32 receiving heat, the metallic coating layer emits low radiation, which is lower than the emitting of the cover unit 32, for reducing the interference of the infrared sensing unit 31.

Figure 7:
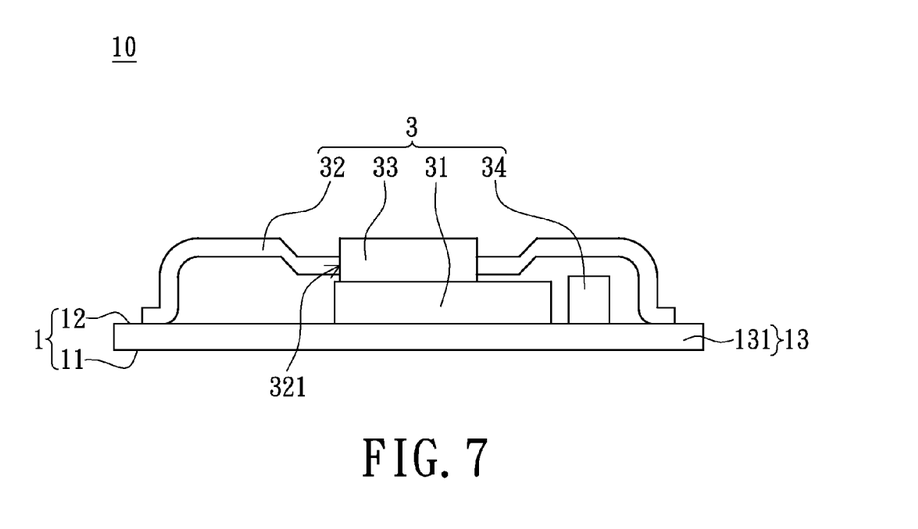
FIG. 7 is a section view of the infrared sensor of the instant disclosure, when a filtering unit wedges in the thru hole of the cover unit.

The filtering unit 33 in this embodiment takes a filter for example. The filtering unit 33 is arranged in the thru hole 321 of the cover unit 32. The filtering unit 33 in this embodiment is adhered on an outer surface of the cover unit 32 by an adhesive (not labeled), but not limited thereto. For example, please refer to FIG. 7, which shows the filtering unit 33 is wedged in the thru hole 321 of the cover unit 32.

The radiation rate of the adhesive is higher than the radiation rate of the cover unit 32, so that the filtering unit 33 is adhered on the outer surface of the cover unit 32 to prevent the radiation of the adhesive from interfering the infrared sensing unit 31 when the cover unit 32 receiving heat.

Thus, the infrared signal, which exists outside the infrared sensor 10, passes through the filtering unit 33, and then the infrared signal filtered by the filtering unit 33 arrives on the temperature measuring chip 311, so that the temperature measuring chip 311 receives the infrared signal via the filtering unit 33. In addition, the filtering units 33 of the infrared sensors 10 can be used for filtering different wavelengths of light respectively. For example, the filtering units 33 of the infrared sensor set as shown in FIG. 3 can be used for filtering two different wavelengths of light, respectively.

The thermistor 34 is electrically connected to the base circuit 21. The thermistor 34 can be an independent component to dispose on the base portion 131, or the thermistor 34 can be a built-in type to arrange in the temperature measuring chip 311 (not shown).

Specifically, when the thermistor 34 is the built-in type, each one of the temperature measuring chip 311 and the temperature compensating chip 312 has the thermistor 34 arranged inside, because the structure of the temperature measuring chip 311 is identical to the structure of the temperature compensating chip 312. But in use, the thermistor 34 can be arranged only in the temperature measuring chip 311.

Figure 8:
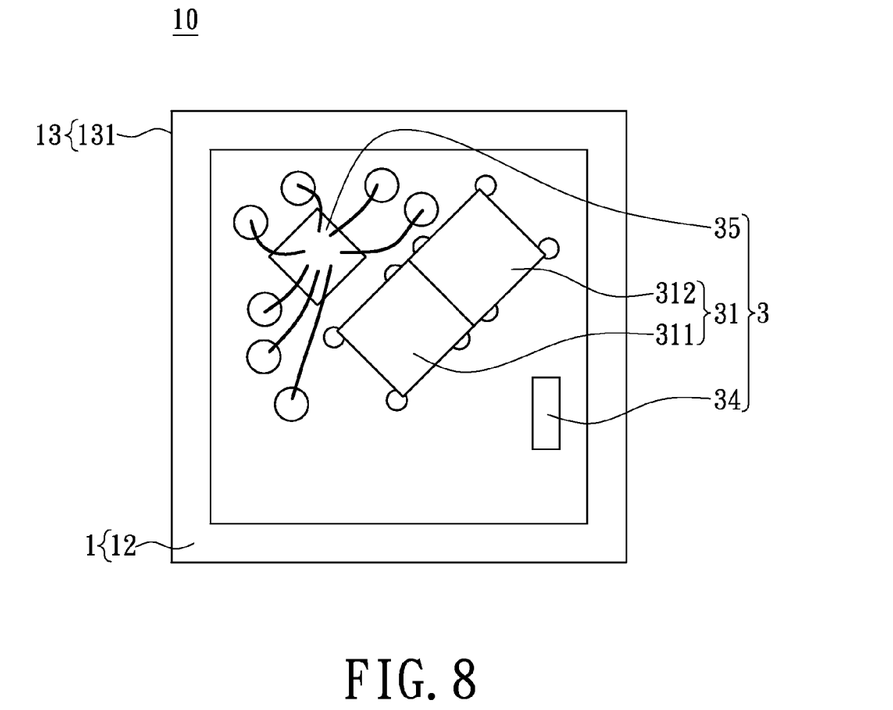
FIG. 8 is a perspective view of the infrared sensor having an auxiliary component unit of the instant disclosure.

Please refer to FIG. 8. Each infrared sensor 10 further has an auxiliary component unit 35, such as an operational amplifier (OP) or an electrically erasable programmable read-only memory (EEPROM).

The auxiliary component unit 35 is arranged inside the cover unit 32, and the auxiliary component unit 35 is disposed on the base portion 131 and electrically connected to the base circuit 21.

Incidentally, the designer can adapt at least one of the flip chip manner, the surface mount technology (SMT) manner, the chip-on-board (COB) manner, and the wire bonding manner for electrically connecting the infrared sensing unit 31, the thermistor 34, and the auxiliary component unit 35 to the base circuit 21.

For example, please refer FIG. 8, which shows the infrared sensing unit 31 electrically connected to the base circuit 32 by the flip chip manner, the thermistor 34 electrically connected to the base circuit 32 by the surface mount technology manner, and the auxiliary component unit 35 electrically connected to the base circuit 32 by the wire bonding manner.

Figure 9:
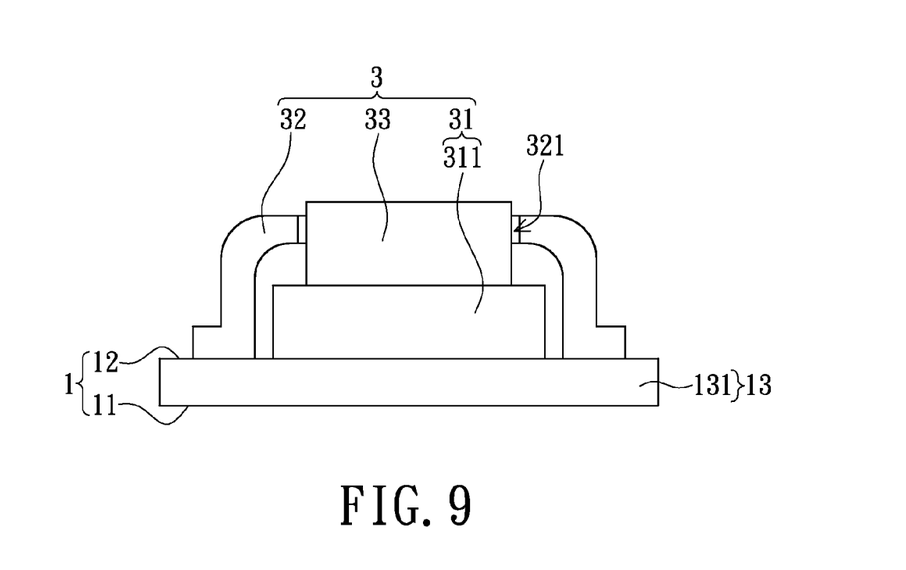
FIG. 9 is a perspective view of the infrared sensor of the instant disclosure, when the infrared sensing unit only has the temperature measuring chip.

Incidentally, please refer to FIG. 9. The size of the base portion 131 and the size of the cover unit 32 can be reduced for only receiving the temperature measuring chip 311, thereby reducing the size of the infrared sensor 10 when the measuring accuracy of the infrared sensor 10 is not the most important.

The above description states the structure of the infrared sensor array 100, and the following description states the manufacturing method of the infrared sensor 10.

Please refer to FIGS. 1 to 4, and 10, which show the step S110 to the step S160 of the manufacturing method of the infrared sensor 10.

Figure 10:
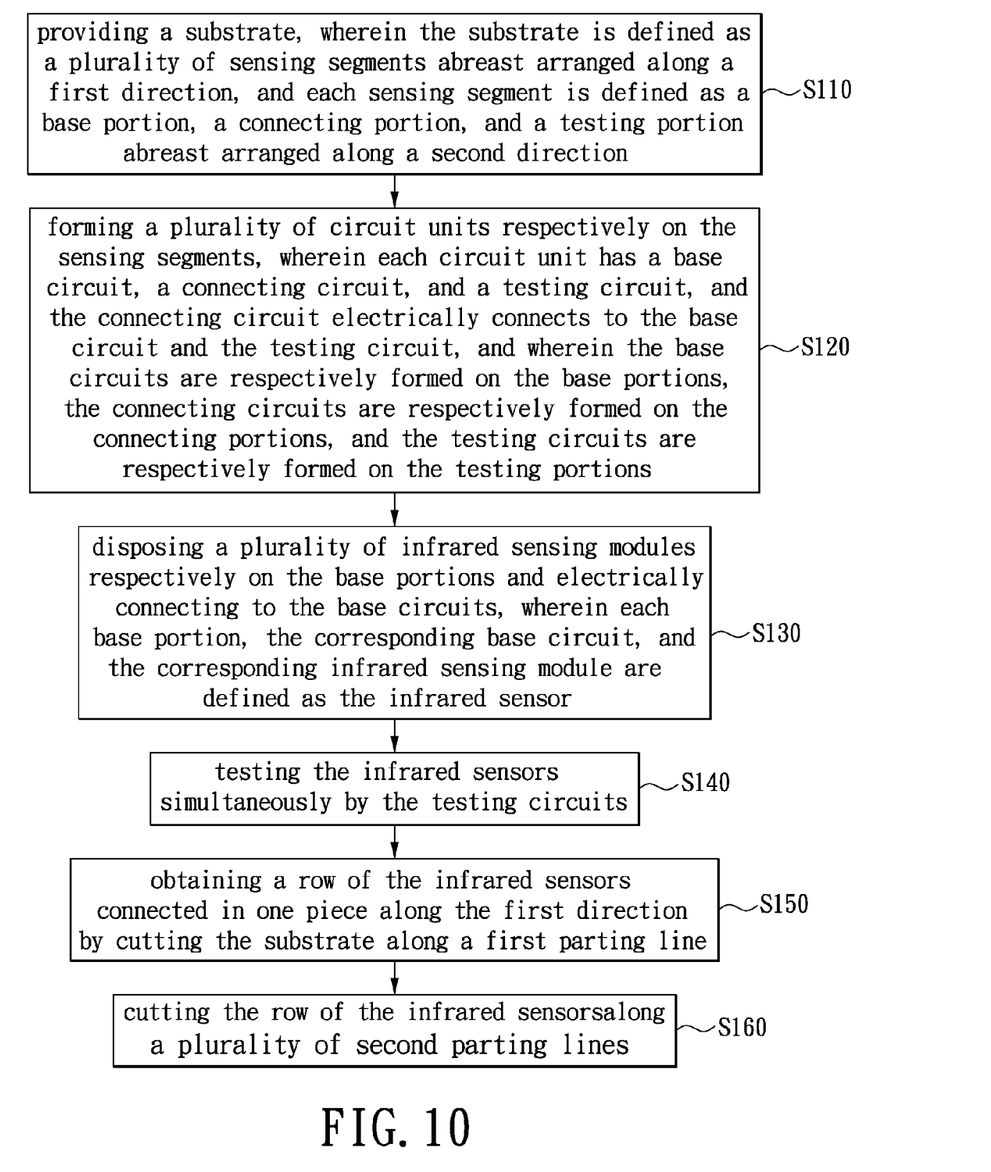
FIG. 10 is a manufacturing flowchart of the infrared sensor of the instant disclosure.

The step S110 includes: providing a substrate 1. Specifically, the substrate 1 is defined as a plurality of sensing segments 13 abreast arranged along a first direction D1, and each sensing segment 13 is defined as a base portion 131, a connecting portion 132, and a testing portion 133 abreast arranged along a second direction D2. The second direction D2 is approximately perpendicular to the first direction D1, but not limited thereto.

The step S120 includes: forming a plurality of circuit units 2 respectively on the sensing segments 13. Specifically, each circuit unit 2 has a base circuit 21, a connecting circuit 22, and a testing circuit 23, and the connecting circuit 22 electrically connects to the base circuit 21 and the testing circuit 23. The base circuits 21 are respectively formed on the base portions 131, the connecting circuits 22 are respectively formed on the connecting portions 132, and the testing circuits 23 are respectively formed on the testing portions 133.

Moreover, when forming the circuit units 2, the testing circuits 23 of the circuit units 2 are formed on an outer surface of the substrate 1.

The step S130 includes: disposing a plurality of infrared sensing modules 3 respectively on the base portions 131 and electrically connecting to the base circuits 21, thereby forming an infrared sensor array 100.

Moreover, each base portion 131, the corresponding base circuit 21, and the corresponding infrared sensing module 3 are defined as the infrared sensor 10.

The step S140 includes: testing all the infrared sensors 10 simultaneously by the testing circuits 23.

The step S150 includes: obtaining a row of the infrared sensors 10 connected in one piece along the first direction D1 by cutting the substrate 1 along the first parting line L1 to remove the connecting portions 132, the testing portions 133, the connecting circuits 22, and the testing circuits 23.

The step S160 includes: cutting the row of the infrared sensors 10 along the second parting lines L2. Specifically, the row of the infrared sensors 10 is cut to separate each infrared sensor 10, or the row of the infrared sensors 10 is cut to form a plurality of infrared sensor sets. Each infrared sensor set has at least two infrared sensors 10 connected in one piece.

Base on the above, the infrared sensor array and the manufacturing method of the infrared sensor are suitable to be used for mass production of the infrared sensors. The infrared sensor array is configured to test all the infrared sensors thereof simultaneously for reducing the testing time and the producing cost.

Moreover, the size of each base portion is only configured to carry one infrared sensing module, that is to say, the contour of each infrared sensor is similar to the contour of each infrared sensing module, thereby reducing the size of the infrared sensor.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An infrared sensor array, comprising:
    a substrate defining a plurality of sensing segments, wherein each sensing segment has a base portion, a connecting portion, and a testing portion, and the connecting portion is arranged between the base portion and the testing portion;
    a plurality of circuit units respectively formed on the sensing segments, wherein each circuit unit has a base circuit, a connecting circuit, and a testing circuit, and the connecting circuit electrically connects to the base circuit and the testing circuit,
    wherein the base circuits are respectively formed on the base portions, the connecting circuits are respectively formed on the connecting portions, and the testing circuits are respectively formed on the testing portions; and
    a plurality of infrared sensing modules respectively disposed on the base portions and electrically connected to the base circuits;
    wherein each base portion, the corresponding base circuit, and the corresponding infrared sensing module are defined as an infrared sensor, and wherein the infrared sensor array is configured to test the infrared sensors simultaneously by the testing circuits.

2. The infrared sensor array as claimed in claim 1, wherein the testing portions and the testing circuits are formed as a golden finger structure.

3. The infrared sensor array as claimed in claim 1, wherein in each infrared sensor, the infrared sensing module comprises:
    an infrared sensing unit disposed on the base portion and electrically connected to the base circuit;
    a cover unit having a thru hole, wherein the cover unit is fixed on the base portion and covering the infrared sensing unit; and
    a filtering unit arranged in the thru hole of the cover unit for enabling the infrared sensing unit to receive an infrared signal via the filtering unit.

4. The infrared sensor array as claimed in claim 3, wherein in each infrared sensor, the infrared sensing unit has a temperature measuring chip aligned to the thru hole of the cover unit and a temperature compensating chip, the temperature measuring chip is configured to receive the infrared signal and a noise, and the temperature compensating chip is configured to receive a noise for eliminating the noise received by the temperature measuring chip.

5. The infrared sensor array as claimed in claim 4, wherein in each infrared sensor, the temperature measuring chip and the temperature compensating chip are connected in one piece to form an elongated structure, the base portion has a square shape, the longitudinal direction of the infrared sensing unit is substantially parallel to a diagonal of the base portion, and the temperature measuring chip and the temperature compensating chip are arranged on the diagonal of the base portion.

6. The infrared sensor array as claimed in claim 4, wherein in each infrared sensor, the temperature measuring chip and the temperature compensating chip are separated from each other, the base portion of the substrate has a square shape, and the temperature measuring chip and the temperature compensating chip are arranged on a diagonal of the base portion.

7. The infrared sensor array as claimed in claim 6, wherein in each infrared sensor, the temperature measuring chip and the temperature compensating chip each has a square shape, a diagonal of the temperature measuring chip and a diagonal of the temperature compensating chip are parallel to the diagonal of the base portion.

8. The infrared sensor array as claimed in claim 3, wherein in each infrared sensor, the infrared sensing module further has a thermistor electrically connected to the base circuit.

9. The infrared sensor array as claimed in claim 3, wherein the filtering units of the infrared sensors are respectively configured to filter different wavelengths of light.

10. The infrared sensor array as claimed in claim 3, wherein in each infrared sensor, the infrared sensing module further has an auxiliary component unit arranged inside the cover unit, and the auxiliary component unit is disposed on the base portion and electrically connected to the base circuit.

11. The infrared sensor array as claimed in claim 1, wherein the substrate defines a first parting line and a plurality of second parting lines, wherein the infrared sensors are arranged on one side of the first parting line, the connecting portions, the testing portions, the connecting circuits, and the testing circuits are arranged on another side of the first parting line, and wherein each second parting line is arranged between two adjacent base portions.

12. The infrared sensor array as claimed in claim 1, wherein the substrate defines a first parting line and a plurality of second parting lines, wherein the infrared sensors are arranged on one side of the first parting line, the connecting portions, the testing portions, the connecting circuits, and the testing circuits are arranged on another side of the first parting line, and wherein at least two of the base portions are arranged between two adjacent second parting lines.

13. The infrared sensor array as claimed in claim 1, wherein the sensing segments are abreast arranged along a first direction, the base portion, the connecting portion, and the testing portion of each sensing segment are abreast arranged along a second direction, and wherein the first direction is approximately perpendicular to the second direction.

14. A manufacturing method of an infrared sensor, comprising:
    providing a substrate, wherein the substrate is defined as a plurality of sensing segments abreast arranged along a first direction, and each sensing segment is defined as a base portion, a connecting portion, and a testing portion abreast arranged along a second direction, and wherein the second direction is approximately perpendicular to the first direction;
    forming a plurality of circuit units respectively on the sensing segments, wherein each circuit unit has a base circuit, a connecting circuit, and a testing circuit, and the connecting circuit electrically connects to the base circuit and the testing circuit, and wherein the base circuits are respectively formed on each the base portions, the connecting circuits are respectively formed on the connecting portions, and the testing circuits are respectively formed on the testing portions; and
    disposing a plurality of infrared sensing modules respectively on the base portions and electrically connecting to the base circuits, thereby forming an infrared sensor array;
    wherein each base portion, the corresponding base circuit, and the corresponding infrared sensing module are defined as the infrared sensor.

15. The manufacturing method as claimed in claim 14, further comprising: testing the infrared sensors simultaneously by the testing circuits after forming the infrared sensor array, and then obtaining a row of the infrared sensors connected in one piece along the first direction by removing the connecting portions, the testing portions, the connecting circuits, and the testing circuits.

16. The manufacturing method as claimed in claim 15, further comprising: cutting the row of the infrared sensors to separate each infrared sensor after obtaining the row of the infrared sensors.

17. The manufacturing method as claimed in claim 15, further comprising: cutting the row of the infrared sensors to form a plurality of infrared sensor sets after obtaining the row of the infrared sensors, and wherein each infrared sensor set has at least two infrared sensors connected in one piece.

* * * * *